United States Patent
Seo et al.

(10) Patent No.: US 10,411,133 B2
(45) Date of Patent: Sep. 10, 2019

(54) METHOD FOR MINIMIZING SURFACE ROUGHNESS OF POLYSILICON LAYER AND THIN FILM TRANSISTOR INCLUDING THE POLYSILICON LAYER

(71) Applicant: Samsung Display Co., Ltd., Yongin-si, Gyeonggi-do (KR)

(72) Inventors: Jong Oh Seo, Seoul (KR); Byung Soo So, Yogin-si (KR); Dong-Min Lee, Yongin-si (KR); Dong-Sung Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/948,097

(22) Filed: Apr. 9, 2018

(65) Prior Publication Data

US 2019/0103495 A1 Apr. 4, 2019

(30) Foreign Application Priority Data

Sep. 29, 2017 (KR) .......................... 10-2017-0128166

(51) Int. Cl.
*H01L 27/14* (2006.01)
*H01L 29/786* (2006.01)
(Continued)

(52) U.S. Cl.
CPC .. *H01L 29/78672* (2013.01); *H01L 21/02675* (2013.01); *H01L 27/1218* (2013.01); *H01L 27/1281* (2013.01); *H01L 29/6675* (2013.01)

(58) Field of Classification Search
CPC combination set(s) only.
See application file for complete search history.

(56) References Cited

U.S. PATENT DOCUMENTS

| | | | |
|---|---|---|---|
| 6,677,222 B1 * | 1/2004 | Mishima | H01L 21/2022 438/488 |
| 2004/0097103 A1 * | 5/2004 | Imai | B23K 26/0604 438/795 |

(Continued)

FOREIGN PATENT DOCUMENTS

| | | |
|---|---|---|
| JP | 4770027 B2 | 7/2011 |
| KR | 101254744 B1 | 4/2013 |

OTHER PUBLICATIONS

Chung et al., "Hysteresis characteristics in low temperature poly-Si thin film transistors", Journal of Information Display, vol. 6, No. 4, 2005. pp. 6-10.

(Continued)

*Primary Examiner* — Caleb E Henry
(74) *Attorney, Agent, or Firm* — Cantor Colburn LLP

(57) ABSTRACT

A manufacturing method of a polysilicon layer of a thin film transistor of a display device, includes: irradiating a first excimer laser beam having a first energy density to an amorphous silicon layer including an oxidation layer thereon, to form a first polysilicon layer including thereon portions of the oxidation layer at grain boundaries of the first polysilicon layer; removing the portions of the oxidation layer at the grain boundaries of the first polysilicon layer; and irradiating a second excimer laser beam having a second energy density of 80% to 100% of the first energy density to the first polysilicon layer from which the portions of the oxidation layer at the grain boundaries thereof are removed, to form a second polysilicon layer as the polysilicon layer of the thin film transistor.

15 Claims, 19 Drawing Sheets

(51) Int. Cl.
*H01L 27/12* (2006.01)
*H01L 21/02* (2006.01)
*H01L 29/66* (2006.01)

(56) References Cited

U.S. PATENT DOCUMENTS

2004/0106244 A1* 6/2004 Kim .................. C30B 13/00
    438/166
2006/0043072 A1* 3/2006 Chen .................. C03C 15/00
    216/88
2016/0343569 A1* 11/2016 Mazzamuto ...... H01L 21/02422

OTHER PUBLICATIONS

Ljungberg et al., "The Effects of HF Cleaning Prior to Silicon Wafer Bonding", J. Electrochem. Soc., vol. 142, No. 4, Apr. 1995, pp. 1297-1303.

* cited by examiner

METHOD FOR MINIMIZING SURFACE ROUGHNESS OF POLYSILICON LAYER AND THIN FILM TRANSISTOR INCLUDING THE POLYSILICON LAYER

This application claims priority to Korean Patent Application No. 10-2017-0128166 filed on Sep. 29, 2017, and all the benefits accruing therefrom under 35 U.S.C. § 119, the entire contents of which are incorporated herein by reference.

BACKGROUND

1. Field

The present disclosure relates to a manufacturing method of a polysilicon layer and a thin film transistor including the same.

2. Description of the Related Art

Generally, as examples of display devices, there are an organic light emitting diode ("OLED") display, a liquid crystal display ("LCD") and a plasma display panel ("PDP").

Among them, the organic light emitting device includes a thin film transistor having an active layer and a gate electrode, and the active layer includes a polysilicon layer.

SUMMARY

An exemplary embodiment provides a manufacturing method of a polysilicon layer having a minimized surface roughness and a thin film transistor including the same.

A manufacturing method of a polysilicon layer of a thin film transistor of a display device, includes: irradiating a first excimer laser beam having a first energy density to an amorphous silicon layer including an oxidation layer thereon, to form a first polysilicon layer including thereon portions of the oxidation layer at grain boundaries of the first polysilicon layer; removing the portions of the oxidation layer at the grain boundaries of the first polysilicon layer; and irradiating a second excimer laser beam having a second energy density of 80% to 100% of the first energy density to the first polysilicon layer from which the portions of the oxidation layer at the grain boundaries thereof are removed, to form a second polysilicon layer as the polysilicon layer of the thin film transistor.

The first energy density may be about 405 millijoules per square centimeter ($mJ/cm^2$) to about 425 $mJ/cm^2$.

In the forming of the first polysilicon layer, the first excimer laser beam may be irradiated to the amorphous silicon layer to be overlapped by 80% to 95% in a direction in which the first excimer laser beam moves along the amorphous silicon layer.

A scan pitch of the first excimer laser beam in the direction in which the first excimer laser beam moves along the amorphous silicon layer may be about 20 micrometers ($\mu m$) to about 40 $\mu m$.

A width of the first excimer laser beam in a direction in which the first excimer laser beam moves along the amorphous silicon layer may be about 450 $\mu m$ to about 510 $\mu m$.

In the forming of the second polysilicon layer, the second excimer laser beam may be irradiated to the first polysilicon layer to be overlapped by 78% to 96% in a direction in which the second excimer laser beam moves along the first polysilicon layer.

The scan pitch of the second excimer laser beam in the direction in which the second excimer laser beam moves along the first polysilicon layer may be about 5 $\mu m$ to about 120 $\mu m$.

The width of the second excimer laser beam in a direction in which the second excimer laser beam moves along the first polysilicon layer may be about 450 $\mu m$ to about 510 $\mu m$.

In the removing of the portions of the oxidation layer, a hydrogen fluoride (HF) solution of about a 0.5% concentration may be coated on the first polysilicon layer including thereon the portions of the oxidation layer at the grain boundaries of the first polysilicon layer, for about 30 seconds to about 180 seconds to remove the portions of the oxidation layer from the first polysilicon layer.

A thin film transistor includes a second polysilicon layer formed by the above-described manufacturing method of the polysilicon layer; and a gate electrode on the second polysilicon layer. A root mean square ("RMS") of surface roughness of the second polysilicon layer is about 2 nanometers (nm) to about 7 nm.

A thin film transistor includes a second polysilicon layer formed by the above-described manufacturing method of the polysilicon layer, and a gate electrode on the second polysilicon layer. A value of a maximum surface roughness RPV (Peak to Valley) of the second polysilicon layer is about 10 nm to about 30 nm.

According to one or more exemplary embodiment, the manufacturing method of the polysilicon layer is provided to minimize the surface roughness of the formed polysilicon layer, and the thin film transistor includes the polysilicon layer having the minimized surface roughness.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
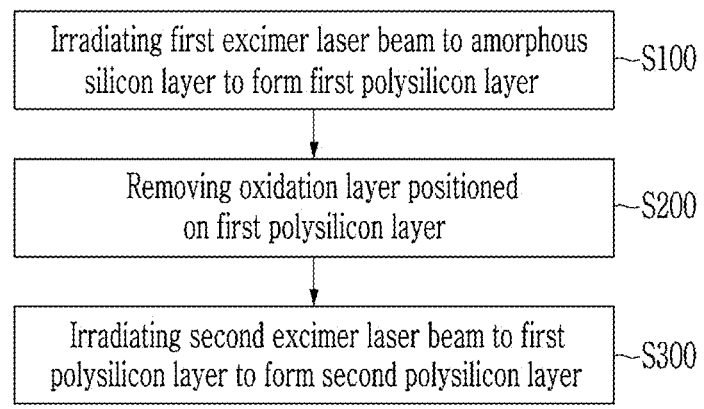
FIG. 1 is a flowchart showing an exemplary embodiment of a manufacturing method of a polysilicon layer according to the invention.

Hereinafter, the invention will be described more fully with reference to the accompanying drawings, in which exemplary embodiments of the invention are shown. As those skilled in the art would realize, the described embodiments may be modified in various different ways, all without departing from the spirit or scope of the invention.

In order to clearly explain the invention, a portion that is not directly related to the invention was omitted, and the same reference numerals are attached to the same or similar constituent elements through the entire specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present.

Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A polysilicon layer within an active layer of a switching element such as a thin film transistor, is formed by crystallizing an amorphous silicon material layer such as by using an excimer laser beam. As this formed polysilicon layer includes a plurality of protrusions positioned corresponding to a grain boundary, surface roughness of the polysilicon layer undesirably increases.

A manufacturing method of a polysilicon layer according to an exemplary embodiment will be described with reference to FIG. 1 to FIG. 4.

FIG. 1 is a flowchart showing an exemplary embodiment of a manufacturing method of a polysilicon layer according to the invention. FIGS. 2(A) to 2(F) are schematic cross-sectional views of exemplary embodiments of structures within a manufacturing method of a polysilicon layer according to the invention.

Figure 2A:
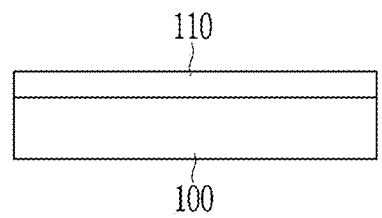
FIGS. 2(A) to 2(F) are schematic cross-sectional views of exemplary embodiments of structures within a manufacturing method of a polysilicon layer according to the invention.

Referring to FIG. 1 and FIGS. 2(A), (B) and (C), a first excimer laser beam LB1 is irradiated to an amorphous silicon (material) layer 100 to form a first polysilicon layer 200 (S100).

In detail, referring to FIG. 2(A), the amorphous silicon layer 100 is formed on a substrate including a buffer layer (not shown). In this case, an oxidation layer 110 that is naturally formed may be positioned on a surface of the amorphous silicon layer 100. An overall structure of the amorphous silicon layer may be considered as including both layers 100 and 110. The oxidation layer 110 may be on a surface of the amorphous silicon layer 100 which is opposite to a surface at which the substrate and buffer layer are disposed.

Figure 2B:
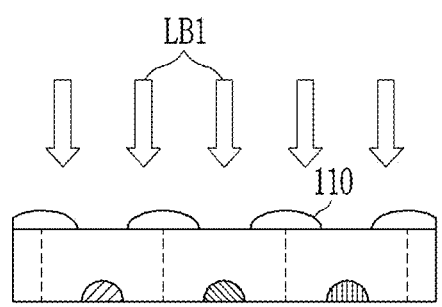

Referring to FIG. 2(B), a first excimer laser beam LB1 having a first energy density is irradiated to the amorphous silicon layer 100 having the oxidation layer 110 thereon. The first excimer laser beam LB1 having the first energy density may be irradiated in plurality to the amorphous silicon layer 100 having the oxidation layer 110 thereon.

Figure 3:
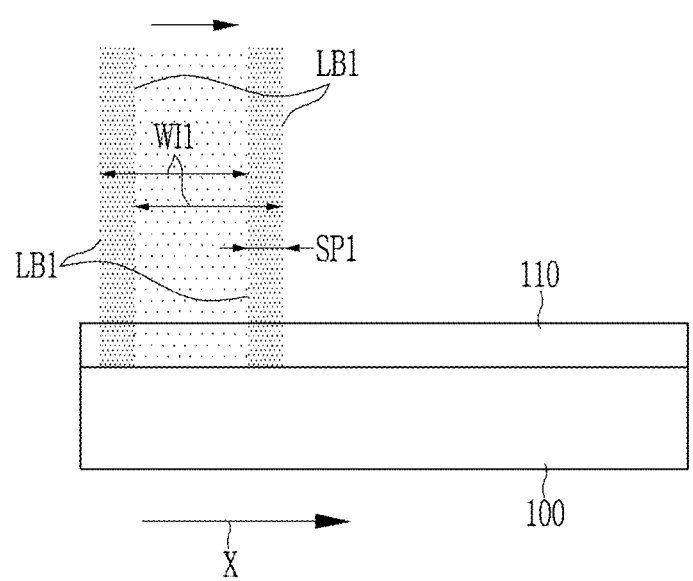
FIG. 3 is a cross-sectional view showing an exemplary embodiment of a scan pitch of a first excimer laser in a manufacturing method of a polysilicon layer according to the invention.

FIG. 3 is a cross-sectional view showing an exemplary embodiment of a scan pitch of a first excimer laser in a manufacturing method of a polysilicon layer according to the invention.

Referring to FIG. 3, a first width WI1 of the first excimer laser beam LB1 may be about 450 micrometers (μm) to about 510 μm. The first energy density of the first excimer laser beam LB1 may be about 405 millijoules per square centimeter (mJ/cm$^2$) to about 425 mJ/cm$^2$. The first excimer laser beam LB1 may be irradiated to overlap the amorphous silicon layer 100 by about 80% to about 95% in one direction X along a plane of the amorphous silicon layer 100. The direction X may be a scan direction in which the first excimer laser beam LB1 is moved along the amorphous silicon layer 100. A first scan pitch SP1 in the one direction X of the first excimer laser beam LB1 may be about 20 μm to about 40 μm.

The layers 100 and 110, as well as the substrate and buffer layer described above, may be disposed in a plane defined by first and second directions which cross each other (e.g., the direction X and a direction extended into the view of FIGS. 2(A) to 2(F) and 3). A thickness of the layers 100 and 110, as well as the substrate and buffer layer described above, may be extended in a third direction which crosses both of the first and second directions (e.g., vertical in FIGS. 2(A) to 2(F) and 3).

Figure 2C:
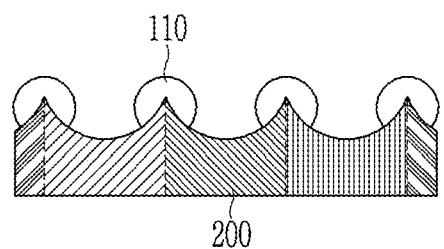

Referring to FIG. 2(C), as the amorphous silicon layer 100 is liquefied and re-solidified by the first excimer laser beam LB1, the first polysilicon layer 200 is formed. Protrusions are formed corresponding to a grain boundary between adjacent portions of the first polysilicon layer 200, and the oxidation layer 110 maybe positioned corresponding to the protrusions. Adjacent portions of the first polysilicon layer 200 in FIG. 2(C) are indicated by different hatching patterns while the grain boundary is indicated by a dotted line in the views of FIGS. 2(A) to 2(F). In FIG. 2(C), a protrusion of the first polysilicon layer 200 is formed at the grain boundary by adjoining maximum thickness portions of the adjacent portions of the first polysilicon layer 200. The oxidation layer 110 may include a discrete structure at the grain boundary to overlap the adjoining maximum thickness portions of the adjacent portions of the first polysilicon layer 200 which form the protrusion of the first polysilicon layer 200. The structure of the oxidation layer 110 may be provided in plurality, spaced apart from each other along the X direction, corresponding to each of the protrusions of the first polysilicon layer 200.

A height of a protrusion corresponding to the grain boundary of the first polysilicon layer 200 may be increased by adding a height of the oxidation layer 110 at the protrusion. That is, the height of a protrusion corresponding to the grain boundary of the first polysilicon layer 200 may include both a height of the first polysilicon layer 200 and a height of a structure of the oxidation layer 110 thereon. Here, the heights may be a distance from a common surface such as the surface of the substrate on which the oxidation layer 110 and the amorphous silicon layer 100 are initially disposed and on which the first polysilicon layer 200 is subsequently disposed having the oxidation layer 110 portions thereon. In an exemplary embodiment, the distance may be taken from the surface of the substrate positioned under the first polysilicon layer 200 (e.g., at a side thereof opposite to that at which the oxidation layer 110 is disposed) to a peak of the protrusions of the first polysilicon layer 200 (e.g., at a maximum thickness portion thereof). Also, the height may be taken as a maximum thickness of a portion of the first polysilicon layer 200.

Figure 2D:
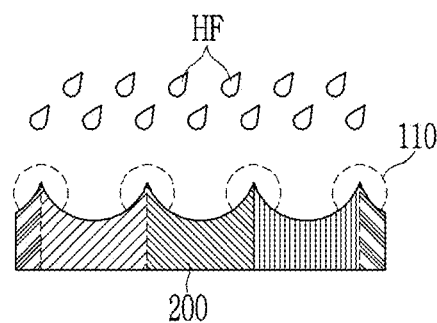

Referring to FIG. 2(D), the oxidation layer 110 including structures separated from each other and positioned on the first polysilicon layer 200 is removed (S200).

In detail, to remove the structures of the oxidation layer 110 respectively positioned corresponding to the protrusions of the first polysilicon layer 200, a hydrogen fluoride (HF) solution of about a 0.5% concentration is coated on the first polysilicon layer 200 having the structures of the oxidation layer 110 thereon, for about 30 seconds to about 180 seconds to remove the structures of the oxidation layer 110 (indicated by the dotted outline of the structures in FIG. 2(D)). The first polysilicon layer 200 from which the structures of the oxidation layer 110 are removed is cleaned such as by using de-ionized water and hydrogenated water.

As the structures of the oxidation layer 110 positioned on the first polysilicon layer 200 are removed, the height of the protrusions corresponding to the grain boundary of the first polysilicon layer 200 is decreased. That is, the removing of the structures of the oxidation layer 110 may also reduce a maximum thickness of portions of the first poly silicon layer 200, such as the maximum thickness or peak at the grain boundaries thereof.

Figure 2E:
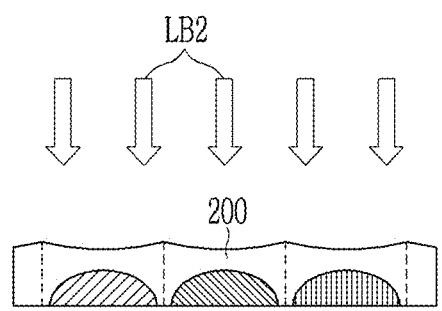

Referring to FIGS. 2(E) and (F), a second excimer laser beam LB2 is irradiated to the first polysilicon layer 200 having the reduced thickness, to form a second polysilicon layer 300 (S300).

In detail, referring to FIG. 2(E), the second excimer laser beam LB2 having a second energy density is irradiated to the first polysilicon layer 200 having the reduced thickness. The second excimer laser beam LB2 having the second energy density may be irradiated in plurality to the first polysilicon layer 200 having the reduced thickness.

Figure 4:
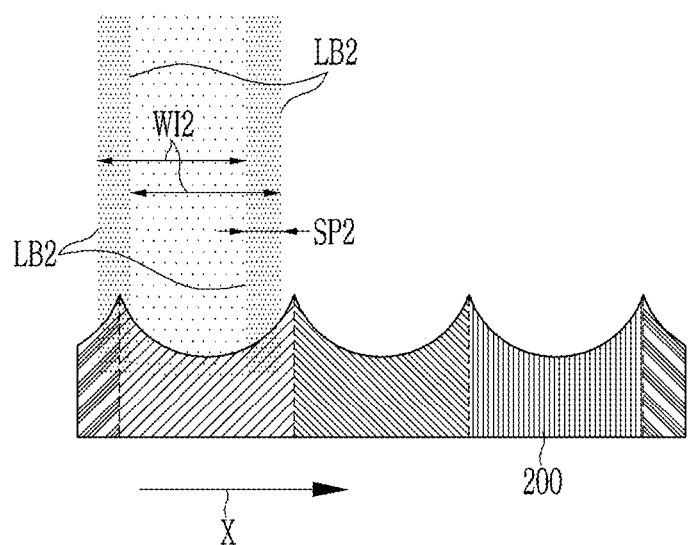
FIG. 4 is a cross-sectional view showing an exemplary embodiment of a scan pitch of a second excimer laser in a manufacturing method of a polysilicon layer according to the invention.

FIG. 4 is a cross-sectional view showing an exemplary embodiment of a scan pitch of a second excimer laser in a manufacturing method of a polysilicon layer according to the invention.

Referring to FIG. 4, a second width WI2 of the second excimer laser beam LB2 may be about 450 μm to about 510 μm. The second energy density of the second excimer laser beam LB2 may be about 80% to about 100% of the first energy density. That is, the second energy density may be about 324 mJ/cm$^2$ to about 425 mJ/cm$^2$ as about 80% to about 100% of about 405 mJ/cm$^2$ to about 425 mJ/cm$^2$. In exemplary embodiments, the second energy density may be about 340 mJ/cm$^2$ to about 425 mJ/cm$^2$.

The second excimer laser beam LB2 may be irradiated to the first polysilicon layer 200 having the reduced thickness to be overlapped by about 78% to about 96% in one direction X. The second scan pitch SP2 in the one direction of the second excimer laser beam LB2 may be about 5 μm to about 120 μm.

Figure 2F:
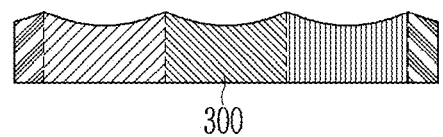

Referring to FIG. 2(F), the first polysilicon layer 200 is liquefied and re-solidified by the second excimer laser beam LB2 to form the second polysilicon layer 300. As the second polysilicon layer 300 is formed from the first polysilicon layer 200 having the reduced thickness, the height of the protrusions corresponding to the grain boundary of the second polysilicon layer 300 decreases from that of the first polysilicon layer 200.

As above-described, as one or more exemplary embodiment of the manufacturing method of the polysilicon layer according to the invention forms the first polysilicon layer 200 having first protrusions from the amorphous silicon layer 100 by using the first excimer laser beam LB1 having the first energy density, the height of the first protrusions corresponding to the grain boundary of the first polysilicon layer 200 is increased by adding the height of the oxidation layer 110. However, the thickness-increasing structures of the oxidation layer 110 positioned on the first polysilicon layer 200 is removed such that the height of the first protrusions formed corresponding to the grain boundary of the first polysilicon layer 200 decreases, and the second polysilicon layer 300 is formed from the first polysilicon layer 200 having the reduced-height protrusions by using the second excimer laser beam LB2 having the second energy density of about 80% to about 100% of the first energy density such that the height of second (final) protrusions corresponding to the grain boundary of the second polysilicon layer 300 further decreases. That is, decreasing the height of the first protrusions to that of the second protrusions reduces a surface roughness of the second polysilicon layer as a final-formed structure of the polysilicon layer.

That is, the manufacturing method of the polysilicon layer of which the surface roughness is minimized is provided.

Experimental results demonstrating an effect of the manufacturing method of the polysilicon layer according to the above-described exemplary embodiment will be described with reference to FIG. 5 and FIG. 6.

Figure 5A:
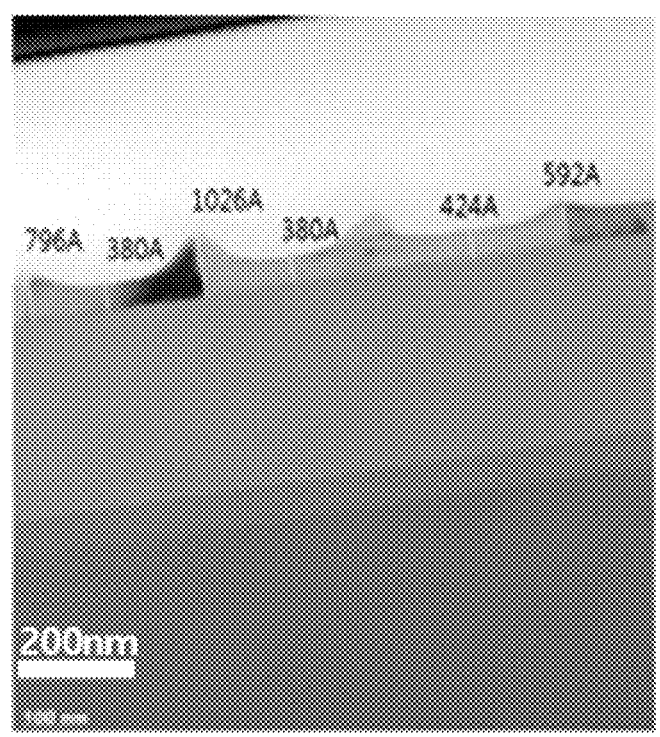
FIGS. 5(A) to 5(C) are transmission electron microscope ("TEM") photos showing an experiment result of structures of a polysilicon layer formed by an exemplary embodiment a manufacturing method of a polysilicon layer according to the invention.
Figure 5B:
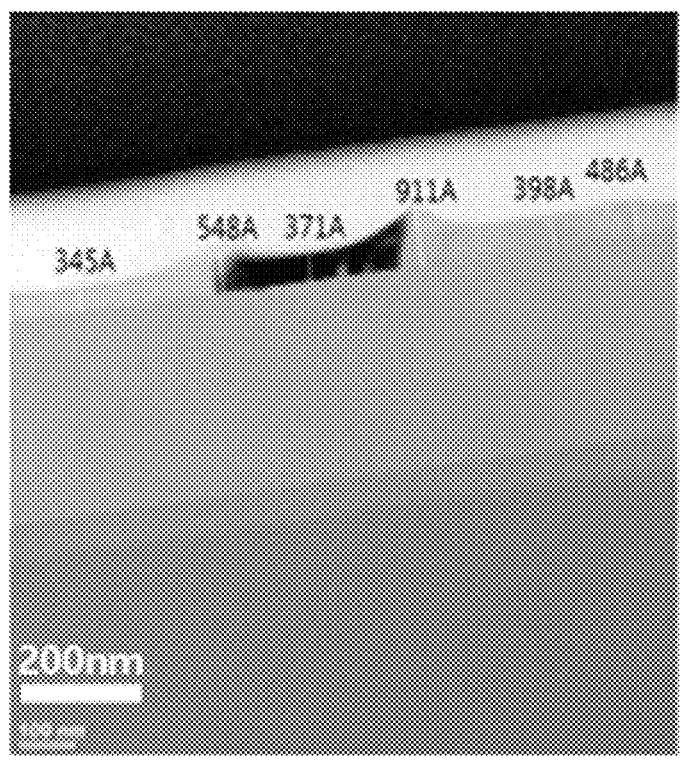
Figure 5C:
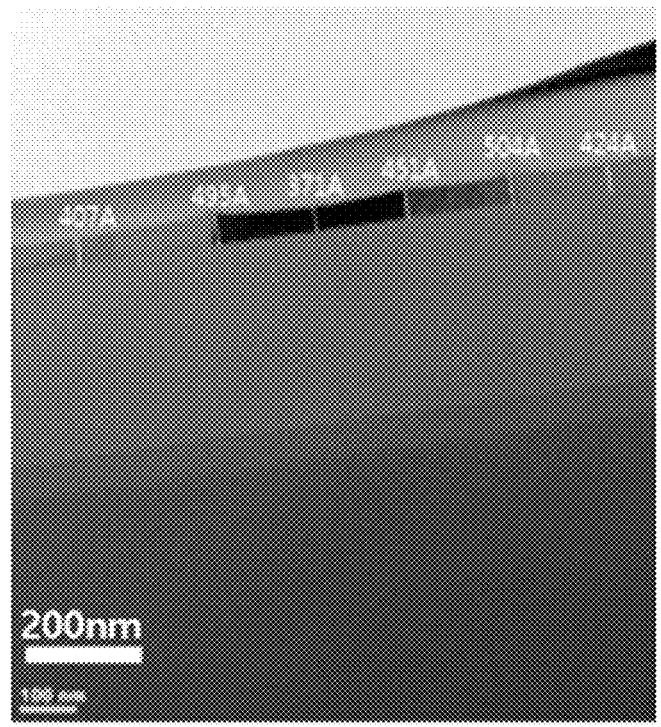
Figure 6:
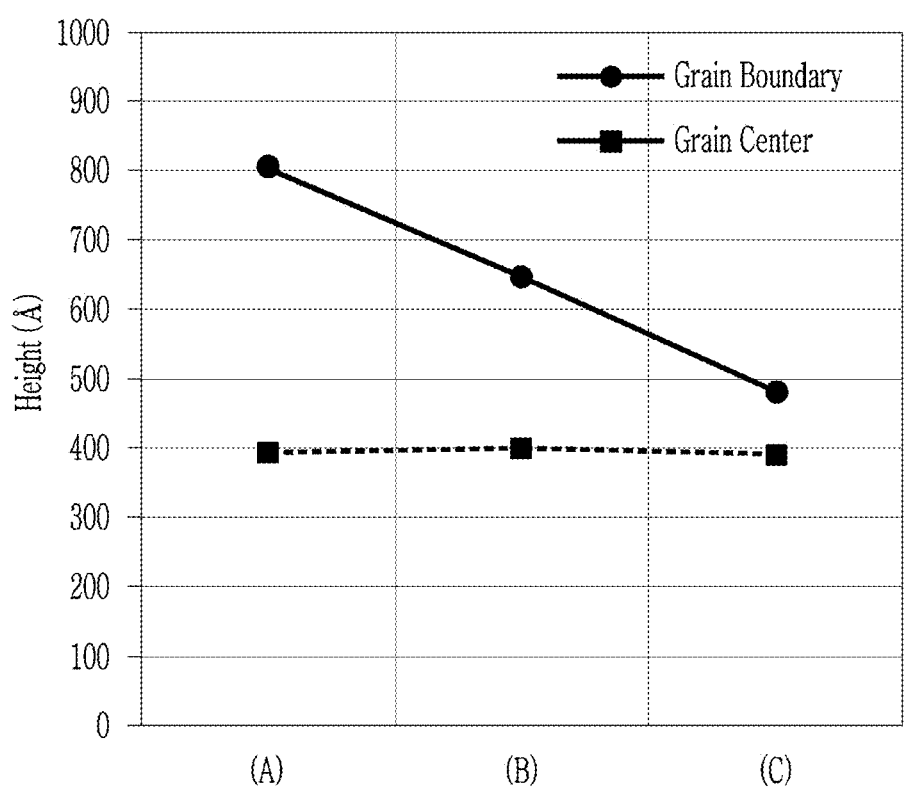
FIGS. 6(A) to 6(C) are graphs showing an experiment result of structures of a polysilicon layer formed by an exemplary embodiment of a manufacturing method of a polysilicon layer according to the invention.

FIGS. 5(A) to 5(C) are transmission electron microscope ("TEM") photos showing experimental results of structures of a polysilicon layer formed by an exemplary embodiment of a manufacturing method of a polysilicon layer according to the invention.

FIG. 5(A) is a photo showing the height of the protrusion of the first polysilicon layer formed by irradiating the first excimer laser beam having the first energy density to the amorphous silicon layer (refer to FIGS. 2(A) to 2(C)).

Referring to FIG. 5(A), it is confirmed that a maximum height among heights of the plurality of protrusions of the first polysilicon layer is 1026 angstroms (A). The heights in FIG. 5(A) may include a total height of the protrusion including a height of material of the first polysilicon layer and material of the oxidation layer positioned thereon (refer to FIG. 2(C)).

FIG. 5(B) is a photo showing the height of the protrusion of the first polysilicon layer from which the structures of the oxidation layer positioned on the first polysilicon layer are removed.

Referring to FIG. 5(B), it is confirmed that a maximum height among heights of the protrusions of the first polysilicon layer from which the oxidation layer is removed is 911 Å. That is, it is confirmed that the height of the protrusion of the first polysilicon layer decreases by removal of the oxidation layer. In FIG. 5(B), the reduced-height protrusion of the first polysilicon layer may be defined with only material of the first polysilicon layer since material of the oxidation layer has been removed therefrom (refer to FIG. 2(D)).

FIG. 5(C) is a photo showing the height of the protrusion of the second polysilicon layer formed by irradiating the second excimer laser beam having the second energy density of about 80% to about 100% of the first energy density to the first polysilicon layer.

Referring to FIG. 5(C), it is confirmed that a maximum height among heights of the protrusions of the second polysilicon layer is 504 Å. That is, it is confirmed that the height of the protrusion of the second polysilicon layer decreases from that of the protrusion of the reduced-thickness first polysilicon layer. In FIG. 5(C), the reduced-height protrusion of the second polysilicon layer may be defined with only material of the second polysilicon layer (refer to FIG. 2(F)).

FIGS. 6(A) to 6(C) are graphs showing experiment results of structures of a polysilicon layer formed by an exemplary embodiment of a manufacturing method of a polysilicon layer according to the invention.

In the graphs shown in FIGS. 6(A), (B) and (C), an x axis corresponds to structures represented in FIGS. 5(A), (B) and (C), and a y axis represents the height of the respective first polysilicon layer or the second polysilicon layer in the structures represented in FIGS. 5(A), (B) and (C) described above, at locations along the respective polysilicon layer.

A grain center in FIGS. 6(A) to 6(C) represents an average lowest height among lowest (e.g., minimum) heights of the grain portions forming a polysilicon layer, where a grain boundary represents an average highest height among highest (e.g., maximum) heights of the grain portions forming the polysilicon layer. Referring to the graphs in FIGS. 6(A) to 6(C), where the first polysilicon layer is formed from the amorphous silicon layer by using the first excimer laser beam having the first energy density (refer to FIGS. 2(A) to 2(D)) and the second polysilicon layer is formed from the first polysilicon layer by using the second excimer laser beam having the second energy density (refer to FIGS. 2(E) and 2(F)), there is no significant change in the average lowest heights of the respective polysilicon layers. However, the average highest heights of the respective polysilicon layers decrease from substantially 800 Å to substantially 500 Å. That is, decreasing the highest heights of the polysilicon layer reduces a surface roughness of the final-formed structure of the polysilicon layer.

As described above, the surface roughness is decreased in the polysilicon layer formed by using one or more embodiment of the manufacturing method of the polysilicon layer according to the invention.

Experimental demonstrating numerical limitations and a threshold range for structures formed in the manufacturing method of the polysilicon layer according to the invention will be described with reference to FIGS. 7 (A) to 7 (D) and FIG. 8.

FIGS. 7(A) to 7(D) are atomic force microscope ("AFM") photos showing experiment results of structures of a polysilicon layer formed by one or more exemplary embodiment of a manufacturing method of a polysilicon layer according to the invention.

Figure 7A:
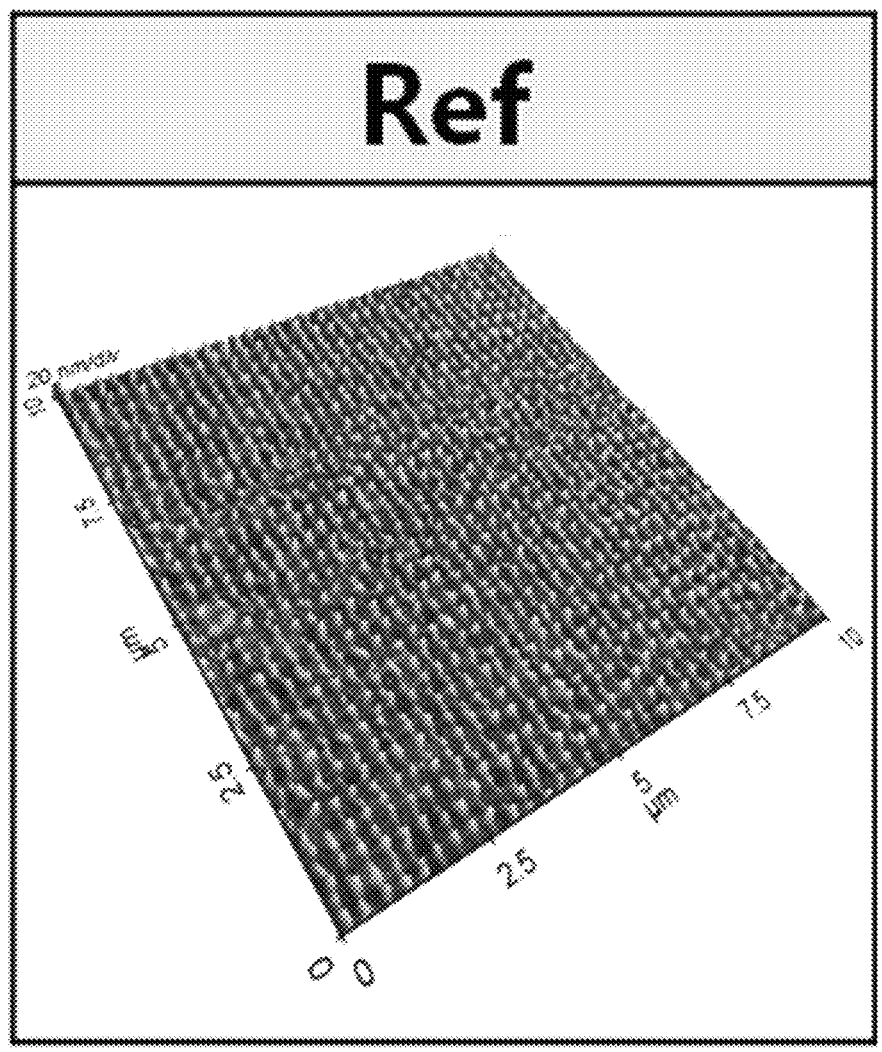
FIGS. 7(A) to 7(D) are atomic force microscope ("AFM") photos showing an experiment result confirming that a numerical limitation is within a threshold range in a manufacturing method of a polysilicon layer according to an exemplary embodiment.

Referring to FIG. 7(A), 'Ref' is a photo showing the surface roughness of a first polysilicon layer formed by using an excimer laser beam having the energy density of 425 mJ/cm$^2$.

Figure 7B:
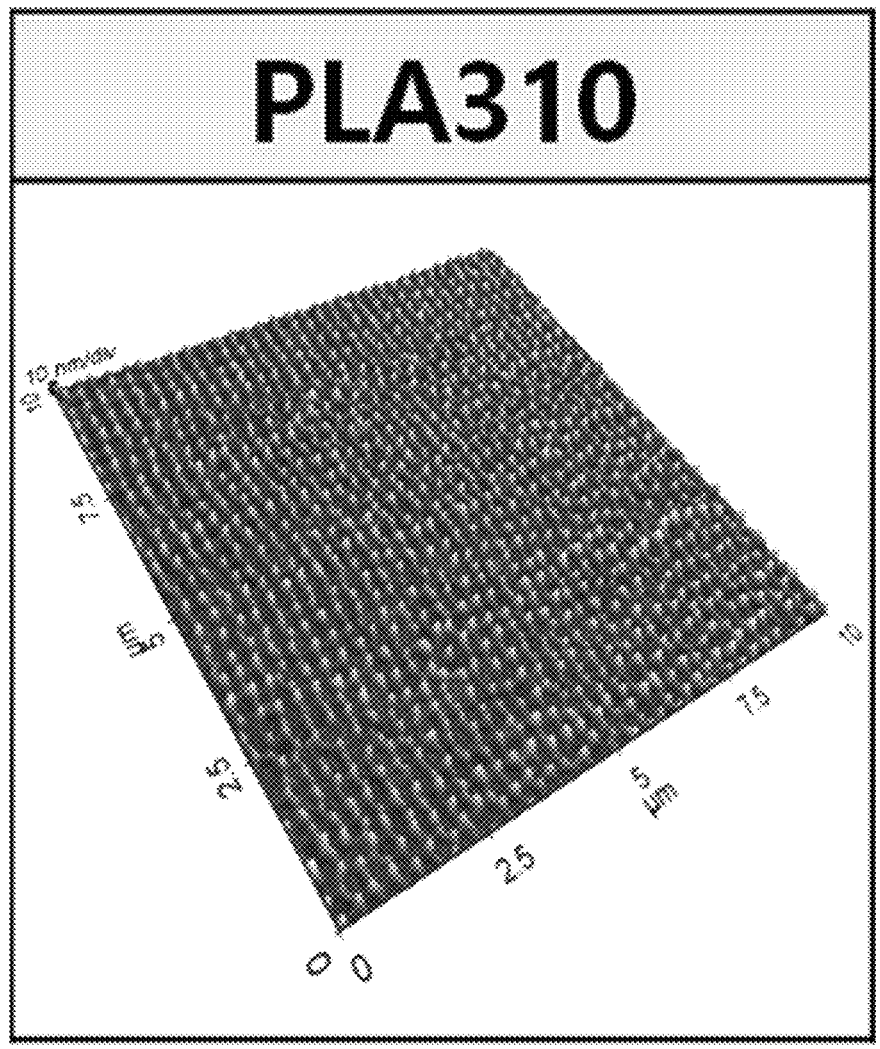

In FIG. 7(B), 'PLA310' is a photo showing the surface roughness of a second polysilicon layer formed from the first polysilicon layer by using a second excimer laser beam having the second energy density of 310 mJ/cm$^2$ that is less than 80% of the first energy density of 425 mJ/cm$^2$, after forming the first polysilicon layer by using the first excimer laser beam having the first energy density of 425 mJ/cm².

Figure 7C:
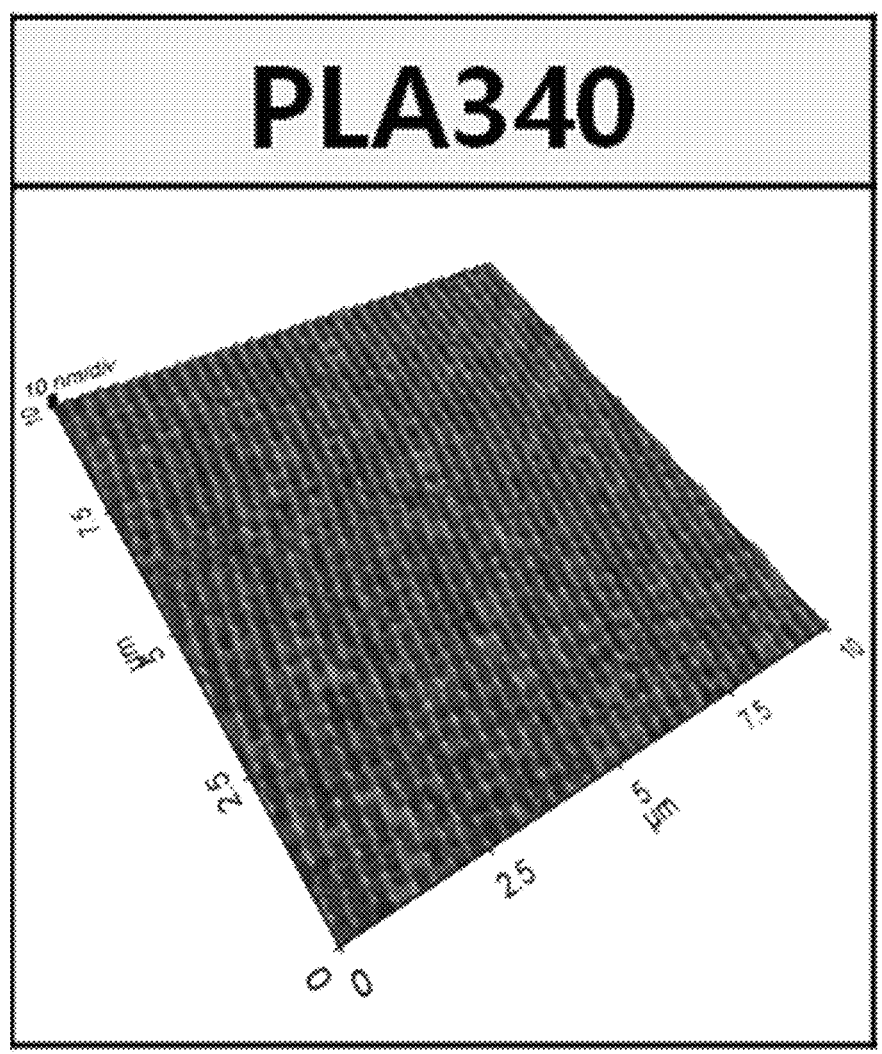

In FIG. 7(C), 'PLA340' is a photo showing the surface roughness of a second polysilicon layer formed from the first polysilicon layer by using a second excimer laser beam having the second energy density of 340 mJ/cm² that is within a range of 80% to 100% of the first energy density of 425 mJ/cm², after forming the first polysilicon layer by using the first excimer laser beam having the first energy density of 425 mJ/cm².

Figure 7D:
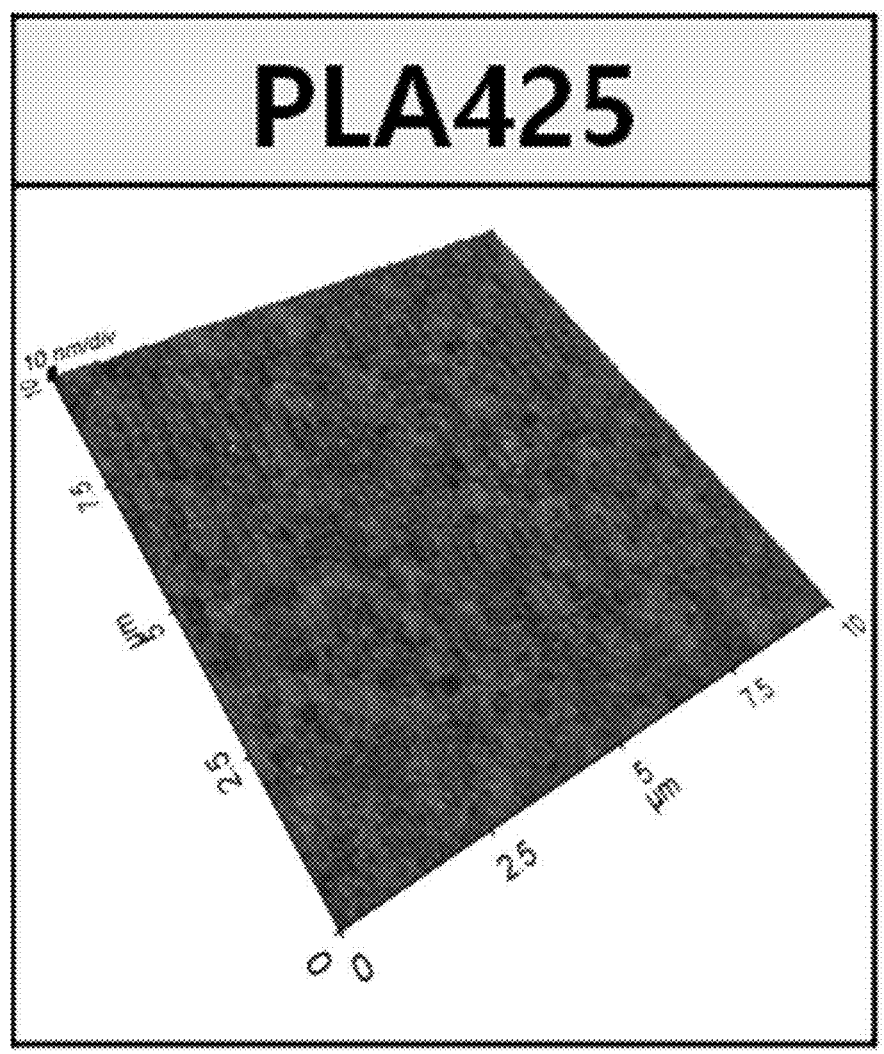

In FIG. 7(D), 'PLA425' is a photo showing the surface roughness of a second polysilicon layer formed from the first polysilicon layer by using a second excimer laser beam having the second energy density of 425 mJ/cm² that is within a range of 80% to 100% of the first energy density of 425 mJ/cm², after forming the first polysilicon layer by using the first excimer laser beam having the first energy density of 425 mJ/cm².

Figure 8:
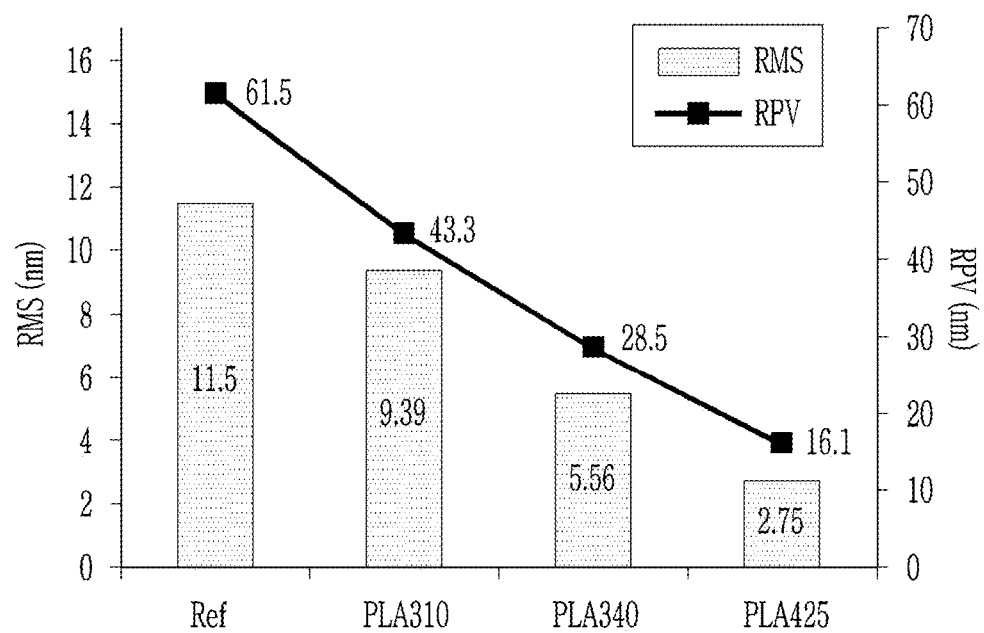
FIG. 8 is a graph showing an experiment result confirming that a numerical limitation is within a threshold range in a manufacturing method of a polysilicon layer according to an exemplary embodiment.

FIG. 8 is a graph showing experiment results demonstrating a range of energy densities used in forming structures of a polysilicon layer by one or more exemplary embodiment of a manufacturing method of a polysilicon layer according to the invention.

Referring to FIG. 8, it is confirmed that a root mean square ("RMS") of the surface roughness of the polysilicon layer according to 'Ref' is 11.5 nanometers (nm), and a value of a maximum surface roughness ("RPV," Peak to Valley) is 61.5 nm.

For the second polysilicon layer formed from the first polysilicon layer by using the second excimer laser beam having the second energy density of 310 mJ/cm² that is less than 80% of the first energy density of 425 mJ/cm² of the first excimer laser beam according to 'PLA310,' it is confirmed that the root mean square ("RMS") of the surface roughness is 9.39 nm, and the value of the maximum surface roughness RPV is 43.3 nm.

For the second polysilicon layer formed from the first polysilicon layer by using the second excimer laser beam having the second energy density of 340 mJ/cm² that is within the range of 80% to 100% of the first energy density of 425 mJ/cm² of the first excimer laser beam according to 'PLA340,' it is confirmed that the root mean square ("RMS") of the surface roughness is 5.56 nm and the value of the maximum surface roughness RPV is 28.5 nm.

For the second polysilicon layer formed from the first polysilicon layer by using the second excimer laser beam having the second energy density of 425 mJ/cm² that is within the range of 80% to 100% of the first energy density of 425 mJ/cm² of the first excimer laser beam according to 'PLA425,' it is confirmed that the root mean square ("RMS") of the surface roughness is 2.75 nm and the value of the maximum surface roughness RPV is 16.1 nm.

As above-described, the surface roughness of the second polysilicon layer according to 'PLA310' using the second excimer laser beam having the second energy density of less than 80% of the first energy density of the first excimer laser beam is slightly decreased compared to the surface roughness of the polysilicon layer according to 'Ref.'

However, the surface roughness of the second polysilicon layer according to 'PLA340' and 'PLA425' using the second excimer laser beam having the second energy density within the range of 80% to 100% of the first energy density of the first excimer laser beam is decreased more compared to the surface roughness of the polysilicon layer according to 'Ref' than the decrease in 'PLA310.'

That is, in one or more exemplary embodiment of the manufacturing method of the polysilicon layer according to the invention, it is confirmed that to achieve a reduction in surfaces roughness for the formed second polysilicon layer, the range of 80% to 100% is a threshold range as a numerical limitation of the second excimer laser beam having the second energy density that is 80% to 100% of the first energy density of the first excimer laser beam.

A display device including a switching element as a thin film transistor according to the invention will be described with reference to FIG. 9.

The display device may display an image with light. The display device according to one or more embodiment of the invention may include an organic light emitting diode ("OLED") display, a liquid crystal display ("LCD") and a plasma display panel ("PDP"). The display device may include a display area at which the image is displayed and a non-display image at which the image is not displayed. A display unit, such as a pixel, may be disposed in the display area to generate and/or emit light used for displaying the image. The display unit may include a switching element which controls operation thereof to generate and/or emit the light. The switching element may include a thin film transistor including terminals (e.g., electrodes) such as a gate electrode, and an active layer disposed relative to the gate electrode. The active layer may include a polysilicon layer. The polysilicon layer may be formed by one or more embodiment of the manufacturing method described above, according to the invention.

An exemplary embodiment of a thin film transistor according to the invention may be manufactured by using the manufacturing method of the polysilicon layer according to the above-described exemplary embodiments.

Figure 9:
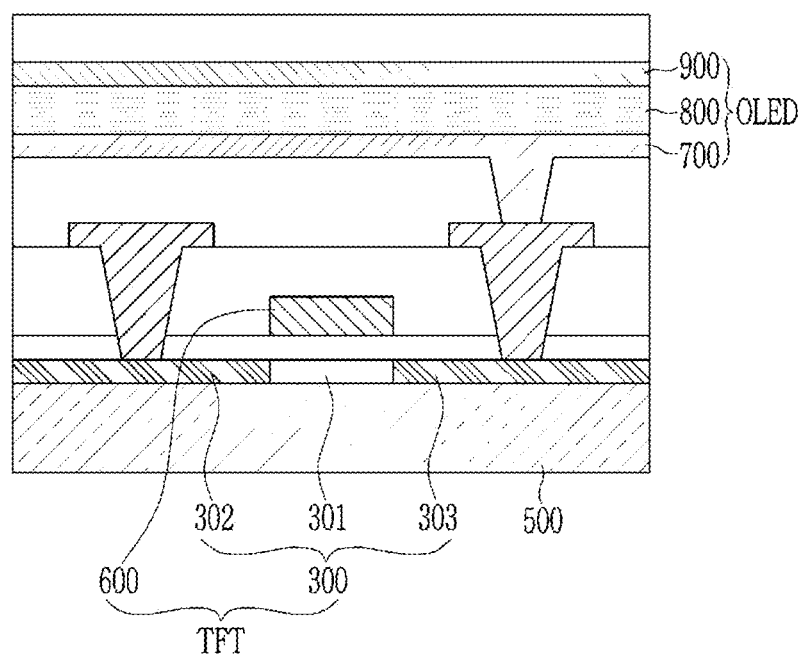
FIG. 9 is a view showing an exemplary embodiment of an organic light emitting device including a thin film transistor according to the invention.

FIG. 9 is a cross-sectional view showing an exemplary embodiment of an organic light emitting device including a thin film transistor including a polysilicon layer as an active layer thereof.

Referring to FIG. 9, the organic light emitting device including the thin film transistor includes a substrate 500 on which is disposed a buffer layer (not shown), a thin film transistor ("TFT") and an organic light emitting element ("OLED").

The thin film transistor ("TFT") includes a polysilicon layer 300 and a gate electrode 600 which is positioned on the second polysilicon layer 300. The thin film transistor ("TFT") may have various disclosed structures, without being limited to that of FIG. 9. The polysilicon layer 300 represents the second polysilicon layer discussed above (refer to 300 in FIG. 2(F) and corresponding experimental results thereof in the views of FIGS. 6 to 8.

The second polysilicon layer 300 includes a channel region 301, a source region 302 and a drain region 303.

The second polysilicon layer 300 is formed of the second polysilicon layer manufactured by irradiating the second excimer laser beam having the second energy density of 80% to 100% of the first energy density applied to the first polysilicon layer, after forming the first polysilicon layer by irradiating the first excimer laser beam having the first energy density to the amorphous silicon layer and removing the oxidation layer on the formed first polysilicon layer.

In an exemplary embodiment, the root mean square ("RMS") of the surface roughness of the second polysilicon layer 300 is about 2 nm to about 7 nm. In another exemplary embodiment, the root mean square ("RMS") of the surface roughness of the second polysilicon layer 300 is about 2.75 nm to about 5.56 nm.

In an exemplary embodiment, the value of the maximum surface roughness RPV of the second polysilicon layer 300 is about 10 nm to about 30 nm. In another exemplary embodiment, the value of the maximum surface roughness RPV of the second polysilicon layer 300 is about 16.1 nm to about 28.5 nm.

The organic light emitting element ("OLED") generates and emits light of a luminance corresponding to the electrical current transmitted from the thin film transistor ("TFT"). The organic light emitting element ("OLED") includes a first electrode 700, an organic emission layer 800 and a second electrode 900. The organic light emitting element ("OLED") may have various disclosed structures.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method of a polysilicon layer of a thin film transistor of a display device, comprising:
   irradiating a first excimer laser beam having a first energy density to an amorphous silicon layer including an oxidation layer thereon, to form a first polysilicon layer including thereon portions of the oxidation layer at grain boundaries of the first polysilicon layer;
   removing the portions of the oxidation layer at the grain boundaries of the first polysilicon layer; and
   irradiating a second excimer laser beam having a second energy density of 80% to 100% of the first energy density to the first polysilicon layer from which the portions of the oxidation layer at the grain boundaries thereof are removed, to form a second polysilicon layer as the polysilicon layer of the thin film transistor.

2. The manufacturing method of claim 1, wherein the first energy density is about 405 millijoules per square centimeter to about 425 millijoules per square centimeter.

3. The manufacturing method of claim 1, wherein in the forming of the first polysilicon layer, the first excimer laser beam is irradiated to the amorphous silicon layer to be overlapped by 80% to 95% in a direction in which the first excimer laser beam moves along the amorphous silicon layer.

4. The manufacturing method of claim 3, wherein a scan pitch of the first excimer laser beam in the direction in which the first excimer laser beam moves along the amorphous silicon layer is about 20 micrometers to about 40 micrometers.

5. The manufacturing method of claim 1, wherein a width of the first excimer laser beam in a direction in which the first excimer laser beam moves along the amorphous silicon layer is about 450 micrometers to about 510 micrometers.

6. The manufacturing method of claim 1, wherein in the forming of the second polysilicon layer, the second excimer laser beam is irradiated to the first polysilicon layer to be overlapped by 78% to 96% in a direction in which the second excimer laser beam moves along the first polysilicon layer.

7. The manufacturing method of claim 6, wherein a scan pitch of the second excimer laser beam in the direction in which the second excimer laser beam moves along the first polysilicon layer is about 5 micrometers to about 120 micrometers.

8. The manufacturing method of claim 1, wherein a width of the second excimer laser beam in a direction in which the second excimer laser beam moves along the first polysilicon layer is about 450 micrometers to about 510 micrometers.

9. The manufacturing method of claim 1, wherein:
   in the removing the portions of the oxidation layer, a hydrogen fluoride solution of a about 0.5% concentration is coated on the first polysilicon layer including thereon the portions of the oxidation layer at the grain boundaries of the first polysilicon layer, for about 30 seconds to about 180 seconds to remove the portions of the oxidation layer from the first polysilicon layer.

10. The manufacturing method of claim 1, wherein the irradiating the first excimer laser beam forms a first maximum thickness of the polysilicon layer at the grain boundaries of the first polysilicon layer, the first maximum thickness including a thickness of the first polysilicon layer and a thickness of the portions of the oxidation layer at the grain boundaries of the first polysilicon layer.

11. The manufacturing method of claim 10, wherein
   the irradiating the second excimer laser beam forms a second maximum thickness of the polysilicon layer at grain boundaries of the second polysilicon layer, the second maximum thickness including only a thickness of the second polysilicon layer at the grain boundaries of the second polysilicon layer, and
   the second maximum thickness at the grain boundaries of the second polysilicon layer is less than the first maximum thickness at the grain boundaries of the first polysilicon layer.

12. The manufacturing method of claim 1, wherein the irradiating the second excimer laser beam forms a root mean square of surface roughness of the second polysilicon layer which is about 2 nanometers to about 7 nanometers.

13. The manufacturing method of claim 1, wherein the irradiating the second excimer laser beam forms a peak-to-valley value of a maximum surface roughness of the second polysilicon layer which is about 10 nanometers to about 30 nanometers.

14. The manufacturing method of claim 1, wherein
   the irradiating the first excimer laser beam disposes the portions of the oxidation layer at the grain boundaries of the first polysilicon layer and spaced apart from each other along the first polysilicon layer, and
   the removing the portions of the oxidation layer at the grain boundaries of the first polysilicon layer removes the portions of the oxidation layer which are spaced apart from each other along the first polysilicon layer.

15. The manufacturing method of claim 1, wherein
   the irradiating the first excimer laser beam defines the first polysilicon layer having a first thickness,
   the removing the portions of the oxidation layer at the grain boundaries of the first polysilicon layer reduces the first thickness of the first polysilicon layer to define the first polysilicon layer having a second thickness smaller than the first thickness, and
   the irradiating the second excimer laser beam defines the second polysilicon layer having a third thickness smaller than each of the first and second thicknesses.

* * * * *